US006937105B2

(12) United States Patent
Mallinson

(10) Patent No.: US 6,937,105 B2
(45) Date of Patent: *Aug. 30, 2005

(54) FREQUENCY LOCKED LOOP WITH IMPROVED STABILITY USING BINARY RATE MULTIPLIER CIRCUITS

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/948,043

(22) Filed: Sep. 22, 2004

(65) Prior Publication Data

US 2005/0046492 A1 Mar. 3, 2005

Related U.S. Application Data

(63) Continuation of application No. 10/351,266, filed on Jan. 23, 2003, now Pat. No. 6,833,765.

(51) Int. Cl.$^7$ .................................................. H03L 7/18
(52) U.S. Cl. .......................................... 331/17; 331/179
(58) Field of Search .............................. 331/17, 25, 12, 331/179; 327/156–159; 375/376

(56) References Cited

U.S. PATENT DOCUMENTS

| | | | | |
|---|---|---|---|---|
| 3,936,762 A | * | 2/1976 | Cox et al. | ..................... 327/159 |
| 5,055,800 A | * | 10/1991 | Black et al. | ................. 331/1 A |
| 5,430,485 A | * | 7/1995 | Lankford et al. | ......... 348/423.1 |

* cited by examiner

Primary Examiner—Joseph Chang
(74) Attorney, Agent, or Firm—Stevens Law Group, P.C.

(57) ABSTRACT

The invention provides a frequency locked loop and related method that enables the conversion of a signal frequency with improved stability. A frequency locked loop embodying the invention includes an input for receiving an input signal and an output for outputting an output signal having a different frequency than the input. A frequency detector is configured to receive the first factored input from the primary channel and the second factored input from the secondary channel, to calculate the difference between the first factored input and the second factored input and to produce an output based on the difference between the two factored inputs. A voltage controlled oscillator is configured to receive the output from the frequency detector, and to produce an output signal. The voltage controlled oscillator ultimately sets the output frequency based on the output of frequency detector. Unlike conventional frequency locked loops, the frequency detector receives the inputs from binary rate multipliers, which operate independently of whether the input factors require complex reduction; this is, independently of whether M and N are large and relatively prime the circuit is not burdened with slow correction, since the binary rate multipliers are not dependent on the reducibility of the respective input factors.

The invention provides a circuit configuration that operates faster and better that any conventional design and that has no inherent pole in the loop. Furthermore, a circuit configured according to the invention operates independent of whether M and N are relatively large irreducible numbers, such as prime numbers.

12 Claims, 4 Drawing Sheets

FREQUENCY LOCKED LOOP WITH IMPROVED STABILITY USING BINARY RATE MULTIPLIER CIRCUITS

BACKGROUND

The invention generally relates to frequency locked loop circuits, and, more particularly, to a frequency locked loop utilizing binary rate multipliers for improved stability.

In the design of so called Phase Locked Loops (PLL's) it is the intention of the designer to create an output frequency that is related in some why to a known reference frequency. PLLs are often used to control the frequency of phase of a signal, or both. The relationship is commonly $F_{out}=(M/N)*F_{ref}$. Where $F_{ref}$ is the input reference frequency of an input signal, and $F_{out}$ is the resulting output signal. The factors of M and N are generated by conventional analytical circuit components to divide an input signal. This gives an output signal of a different frequency than the input signal. Generally, most conventional PLL implementations proceed as follows. Since $F_{out}=(M/N) F_{ref}$, it follows that $F_{out}/M=F_{ref}/N$. Hence digital dividers are provided to create the common frequency $F_{out}/M$ which is the same as $F_{ref}/N$, and a means referred to as a Frequency detector is employed. The frequency detector is operable at this common frequency and configured with analog filter components to control a Voltage Controlled Oscillator (VCO) that is responsible for generating the desired output frequency, $F_{out}$. By use of feedback it can be shown that the VCO may be made to "lock" onto the correct frequency and further adjustment within the loop then ceases when $F_{out}/M$ is indeed equal to $F_{ref}/N$. This clearly then is a feedback loop, where the difference between $F_{out}/M$ and $F_{ref}/N$, the output from the frequency detector, is the error signal driving the loop.

One common problem exists that loop is of order greater than one because a phase difference is detected in the frequency detector. This is because phase, being the integral of frequency, implies that there is a 90 degree phase shifted response from the VCO input voltage. This is mathematically to imply that there is a pole in the loop response created by the action of measuring phase in the frequency detector and controlling frequency in the VCO. Thus, the analog filter is complex and is required to have a zero to remove the inherent pole. Thus it is at least a second order control system requiring two frequency dependant devices (commonly two capacitors) of known and predictable ratio.

Secondly, the signal to adjust the loop is derived from the frequency detector. As a result, the error signal is available at the rate of $F_{out}/M$ in most cases. For the cases when M and N are factors that cannot be further reduced, such as prime factors, the frequency detectors are unable to reduce a large fraction of M/N to a manageable number. For example, a fraction of 1771/3997, two prime factors that cannot be further reduced, would yield the fractions of the input frequency divided by 1771 and the VCO frequency divided by 3997. As a result, the output of the frequency detector is at a low frequency, as corrections are made at these relatively small fractions of the VCO operating frequency. Thus the loop is slow to respond to changes in the control input (the reference input signal).

One proposed solution to this second problem is in the form of a variable rate pre-scaler, or a "pulse swallowing" pre-scaler. Such a device estimates reductions of fractions having large numerators and/or divisors to produce more manageable factors. Pulse swallowing pre-scalers are well known in the art and are able to mitigate the problem of large relatively prime M and N factors at the expense of added complexity. Nevertheless, there still exist problems of inaccuracy from the estimates made and slow speed from the calculations required to perform such reductions.

Another drawback to employing conventional phase locked loops is that the loop error is largely dependent on loop filter values. The values of resistance ("R") and capacitance ("C") in the loop filter can vary, and conventional loops, being second order control systems, are dependent on the relative value of at least two time constants. Finally, the design of a frequency control loop based on the measurement of phase in the loop error detector, whether or not pulse swallowing techniques are used, requires that the noise present at the error detector output is passed to the VCO control node—this is a consequence of the required zero in the loop filter. Circuit designers have therefore been led to introduce yet a third frequency dependant component to "roll off" this noise a pole frequency substantially above the loop unity gain cross over. Thus, at least two and possibly three or more frequency dependant elements must be designed in the conventional frequency control loop. All of these components necessarily have a bearing on the loop dynamics.. As such, the components have an effect on the operation of the circuit loop, such as, settling time, stability, and other factors. Thus, choosing these values in a circuit is important to a circuit design and can be difficult.

Therefore, there exists a need for a device having improved performance factors over phase locked loops. As will be seen below, the invention accomplishes this in an elegant manner.

SUMMARY OF INVENTION

The invention provides a frequency locked loop and related method that enables the conversion of a signal frequency with improved stability. A frequency locked loop embodying the invention includes an input for receiving an input signal and an output for outputting an output signal having a different frequency than the input. A frequency detector is configured to receive the first factored input from the primary channel and the second factored input from the secondary channel, to calculate the difference between the first factored input and the second factored input and to produce an output based on the difference between the two factored inputs. A voltage controlled oscillator is configured to receive the output from the frequency detector, and to produce an output signal. The voltage controlled oscillator ultimately sets the output frequency based on the output of frequency detector. Unlike conventional frequency locked loops, the frequency detector receives the inputs from binary rate multipliers, which operate independently of whether the input factors require complex reduction; this is, independently of whether M and N are large and relatively prime the circuit is not burdened with slow correction, since the binary rate multipliers are not dependent on the reducibility of the respective input factors.

The invention provides a circuit configuration that operates faster and better that any conventional design and that has no inherent pole in the loop. Furthermore, a circuit configured according to the invention operates independent of whether M and N are relatively large irreducible numbers, such as prime numbers.

DETAILED DESCRIPTION

The invention is described below in one embodiment in the context of a frequency locked loop having improved performance characteristics, including improved stability. It will be appreciated by those skilled in the art, however, that other useful applications of the invention may be implemented in applications where frequency locked loops are useful, without departing from the spirit and scope of the invention, where the scope is defined in the appended claims and their equivalents.

The invention provides a frequency locked loop and related method that has improved stability. A circuit configured according to the invention overcomes many shortcomings of conventional circuits, such as the problems of phase locked loops having pulse swallowers discussed above. It does not require a pulse swallowing pre-scaler as in conventional PLLs. One advantage of such a frequency locked loop configured in accordance with the invention is that, being a first order control system, it is stable, regardless of the values of resistance ("R") or capacitance ("C") in the loop filter. A simple RC circuit, where R=100 kohms and C=10 pf would suffice for most applications. The frequency is always locked and stable independent of these values.

A frequency locked loop embodying the invention includes an input for receiving an input signal and an output for outputting an output signal having a different frequency than the input. The circuit further a binary rate multiplier (BRM) circuit. According to the invention, the BRM is configured to factor in a first factor value to produce a first factored input. In a preferred embodiment, the first factor value is related to the input and output frequencies, and includes a predetermined factor value that is specific to the application. A frequency detector is configured to receive the first factored input from the primary channel and the second factored input from the secondary channel, to calculate the difference between the first factored input and the second factored input and to produce an output based on the difference between the two factored inputs. A voltage controlled oscillator is configured to receive the output from the frequency detector, and to produce an output signal. The voltage controlled oscillator ultimately sets the output frequency based on the output of frequency detector.

Unlike conventional PLLs, the frequency detector in the frequency locked loop receives the inputs from BRMs, which operate independently of whether the input factors require complex reduction, greatly slowing down the rate at which the incoming signal is being corrected. Unlike conventional configurations, the circuit is not burdened with this slow correction, since the BRMs are not dependent on the reducibility of the respective input factors. Thus, a circuit configured according to the invention will not suffer from low speed and high error.

Figure 1:
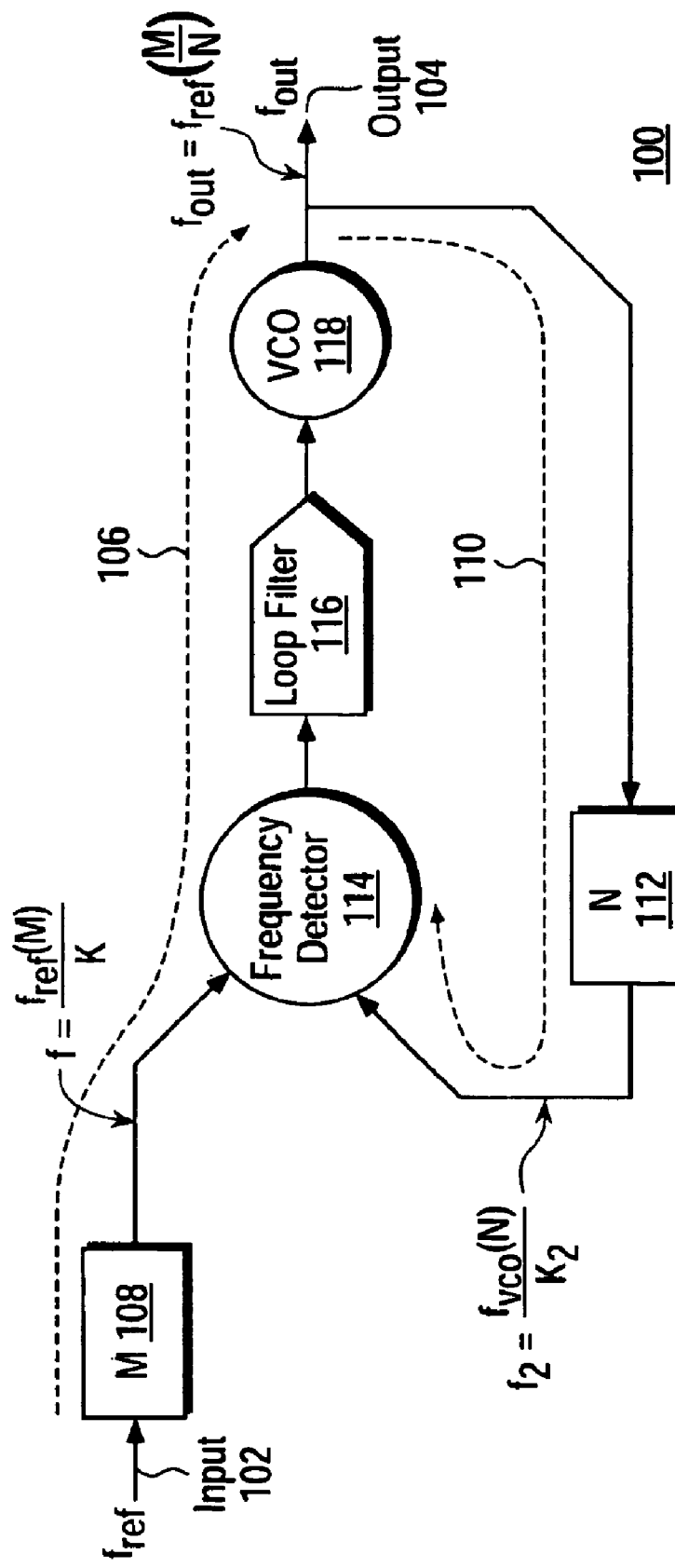
FIG. 1 is a diagrammatic view of a voltage to current converter according to the invention.

Referring to FIG. 1, one embodiment of a frequency locked loop 100 configured according to the invention is illustrated. The system includes an input 102 that is configured to receive a reference signal, $f_{ref}$, and an output 104 configured to output an output signal, $f_{out}$. The output is related to the input by the equation:

$$f_{out} = f_{ref}(M/N) \qquad (1)$$

The circuit is composed of a primary path 106 through which the input signal is processed. The input signal is received by a primary loop BRM 108, having a multiplier factor M that outputs a signal from the BRM as:

$$f = \frac{f_{ref}(M)}{K}. \qquad (2)$$

The circuit further includes a secondary loop 110 having a secondary loop BRM 112. The output of the secondary loop BRM is:

$$f = \frac{f_{VCO}(N)}{K_2} \qquad (3)$$

According to the invention, in contrast to conventional designs, the frequency locked loop operates with multipliers, the BRMs, rather than dividers, to adjust the output frequency. The roles of M and N are therefore different than the corresponding values of the conventional divider based circuit. The result is a circuit that adjusts the output frequency relative to the input frequency with increased stability and speed. Both BRMs output into a frequency detector 114. The frequency detector is configured to detect the frequency between the two input signals, and output the result to the loop filter 116. The loop filter is configured to filter out signal noise, and may be any one of many conventional loop filter circuits, such as an RC circuit, known in the art. The loop filter outputs to a voltage control oscillator ("VCO") 118. The VCO adjusts its output frequency according to the difference in frequencies of the BRMs. In contrast to conventional systems, in a circuit configured according to the invention, there is no comparison of the leading edges of the two BRM outputs. Instead, the signal from the frequency detector is received by the VCO via the loop filter, and the VCO adjusts the frequency of the signal to correct the output signal frequency.

In operation, one embodiment may be configured such that the primary BRM does not operate as fast as the secondary BRM. The secondary BRM may be configured to operate at faster speeds to more rapidly process an input signal for the frequency detector. For example, the secondary BRM may be configured to operate at 100 MHz, while the primary BRM operates at 1 MHz.

Figure 2:
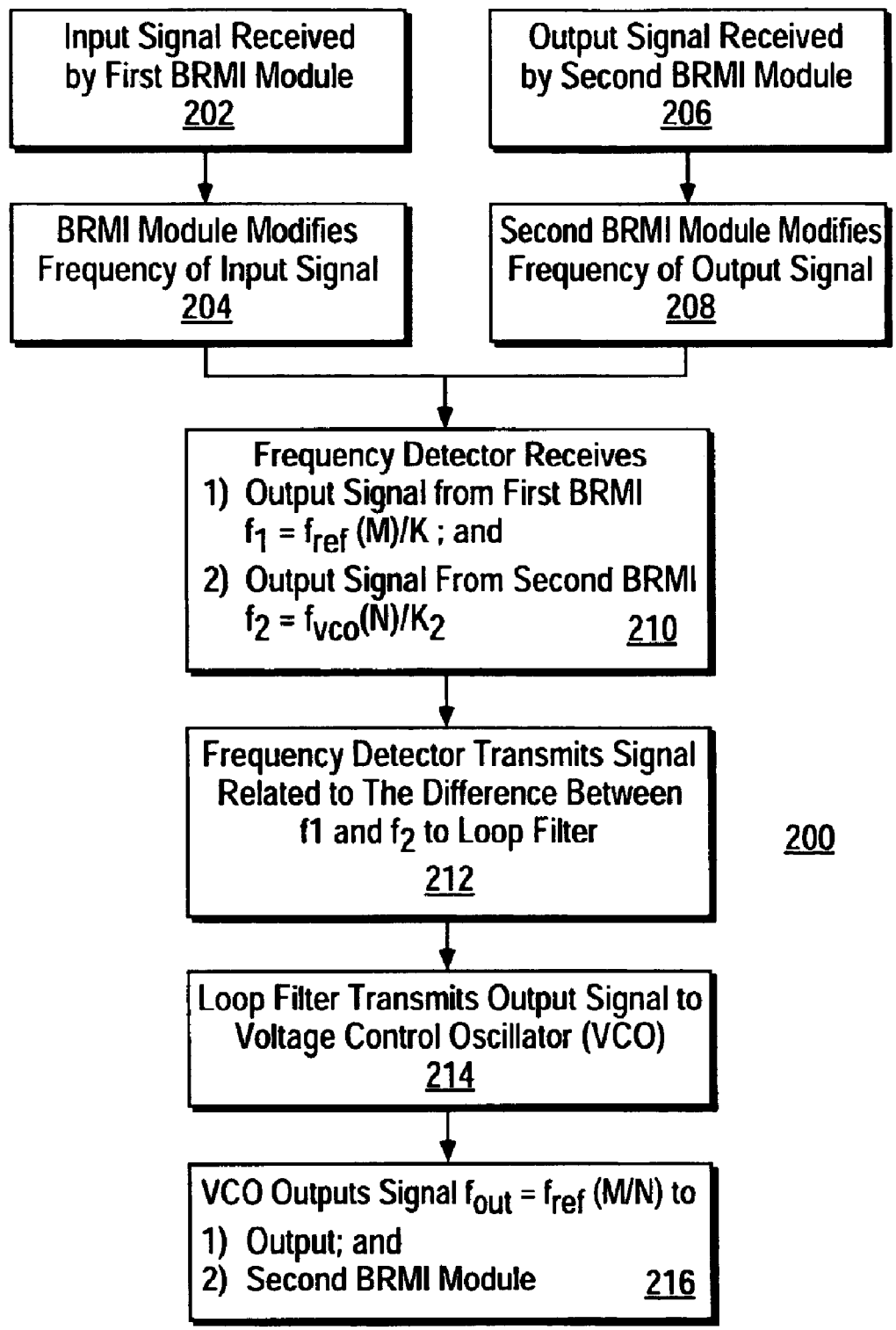
FIG. 2 is a flow diagram illustrating the function of one embodiment of the invention.

Referring to FIG. 2, a flow chart illustrating one embodiment of operation of the circuit of FIG. 1 is illustrated. The process begins in Step 202, where an input signal is received by the first BRM module located in the primary path 106, FIG. 1, of the frequency locked loop circuit. The primary path is that from the reference input signal. The BRM module modifies the frequency of the input signal according to the formula (2) above, and inputs the result to the frequency detector. Simultaneously, when an output signal is received by the secondary BRM module in Step 206, and modified according to formula (3) in Step 208. The secondary input path is that from the VCO. In step 210, the two signals are received by the frequency detector. The frequency detector then responds to the difference in frequencies from the BRM outputs in step 212. In one embodiment, the frequency detector creates two output signals: one to indicate that that VCO frequency should decrease, one to indicate that the VCO frequency should increase. A request to increase the frequency is generated by every positive edge of the primary BRM and a request to decrease the frequency is issued on every positive edge of the secondary BRM. Consequently, the increase and decrease outputs will have substantially no effect when the rate of arrival of positive edge of the primary BRM is the same as the rate of arrival of positive edges of the secondary BRM. These increase and decrease signals are essentially digital in nature and are related to the edges of the output of the BRMs. These signals may conveniently be connected to an increase or decrease the magnitude of an analog signal such a method are well known in the art. This analog signal is then filtered by the loop filter which receives the signal and transmits a filtered signal to the VCO in step 214. In Step 216, the VCO then outputs an output signal to both the output node, $f_{out}$, and the secondary BRM module. The process continues until equilibrium is reached, i.e. when the predetermined frequency difference between the input and the output is stably reached.

Those skilled in the art will note that this process of assessing the rate of arrival of positive edges from the BRMS is essentially an asynchronous process—the secondary BRM being driven by the VCO and the primary by an external input. Since the VCO and the reference input are asynchronous, logic that receives input from both sources will necessarily be asynchronous and as such can be problematic to design. As an option feature for use in conjunction with an embodiment of the invention one means is provided to address the both lack of synchronicity and to show how the decrease the increase pulses may be derived. This example operates by synchronising all events into the reference signal clock domain.

Figure 3:
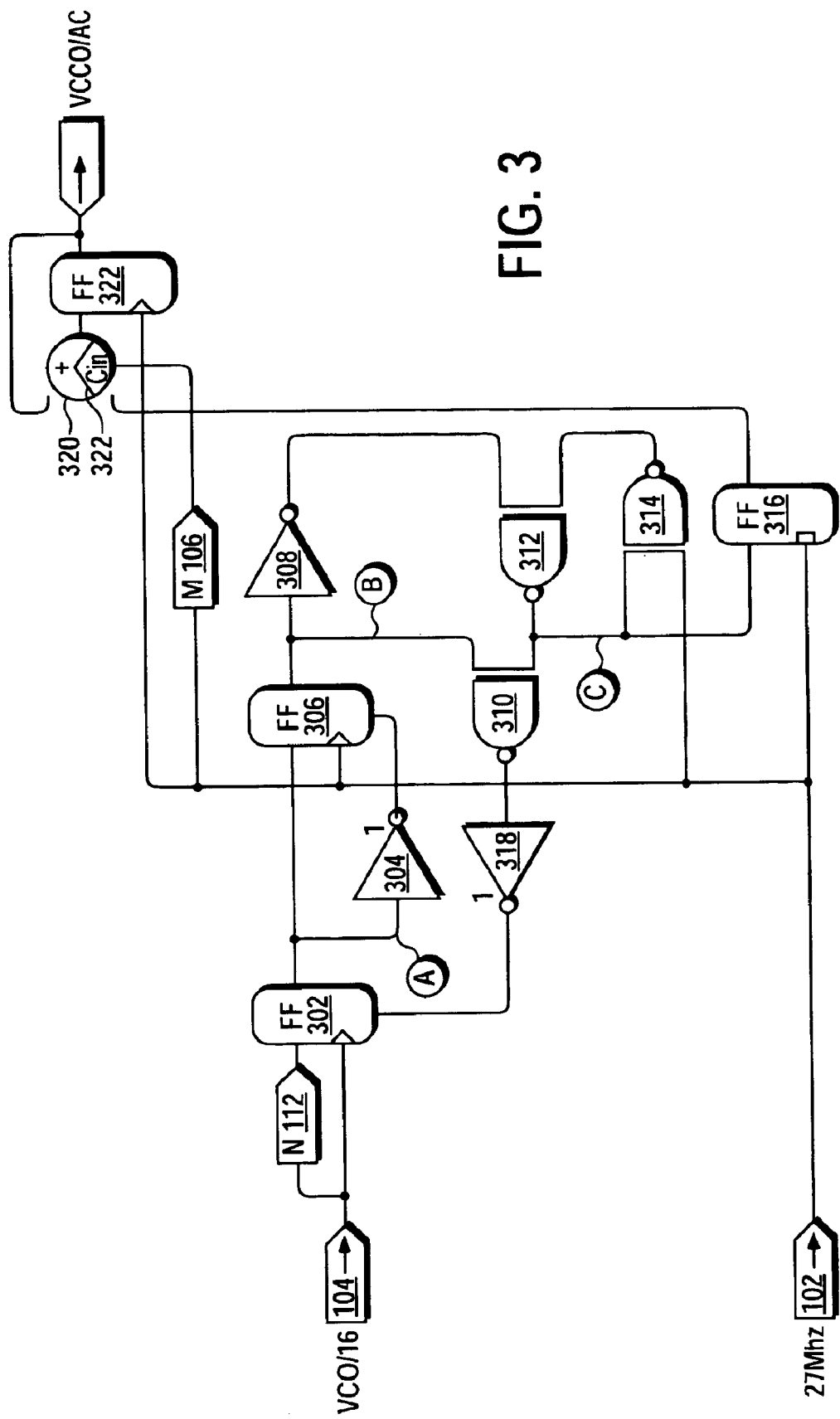
FIG. 3 is a diagrammatic view of a means to generate the increment and decrement signals to the VCO and FIG. 4 is a flow diagram illustrating the function of one embodiment of the invention.
Figure 4:
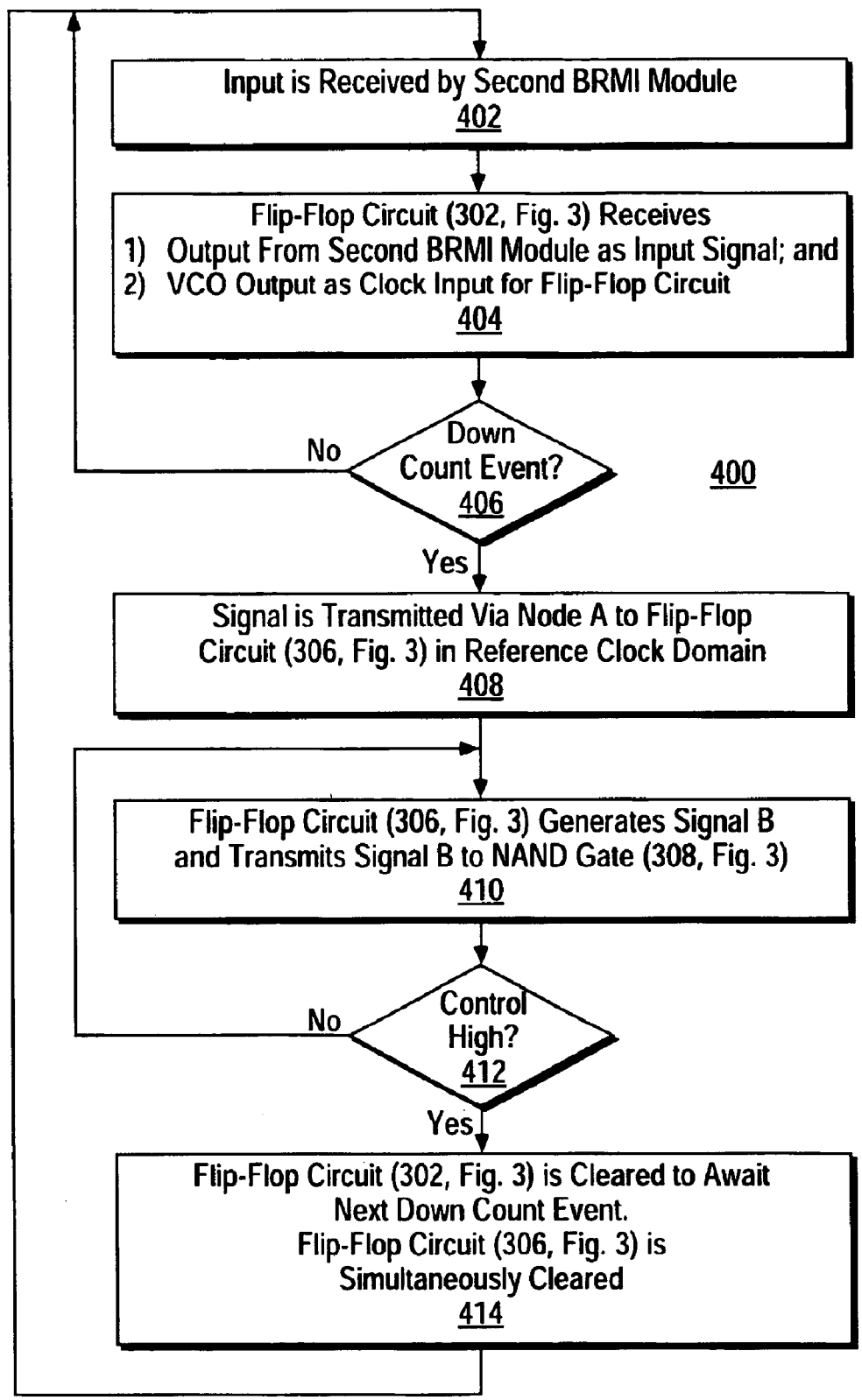

Referring to FIG. 3, a more detailed embodiment of a frequency locked loop of FIG. 1 is illustrated. The flip flop circuit 302, which may be a common D-type flip flop, receives a signal from the Secondary BRM 112, and also receives the input signal directly as a clock signal. The purpose of element 302 is simply to "retime" the BRM output event to the clock (the BRM may be designed to have a delayed output relative to its clock) In operation, Node A, the path of the output signal from the flip flop 302, indicates that a down count event is pending in the VCO timing domain. This pending state is registered into the reference clock of the second flip flop 306. This creates the signal at node B, indicating a request for a down count has been synchronized. Upon receipt of the signal from node B, latched state signal at Node C is set. At this point, latch C contains the data bit indicating a "down" or decrease event. This step has occurred synchronised to the positive edge of the reference input clock. Data bits contained in 302 and 306 can be cleared, and thereby set them back to the state awaiting the next edge from the secondary BRM. The state signal at Node C persists due to the cross-coupled gate made up of NAND gates 312, 314, which is in a latched state. On the occurrence of a low edge of the clock reference signal, the holding latch is cleared and the state of Node C has been captured into the third flip flop 316 to hold the synchronous down request valid until the next clock edge. In a preferred embodiment, flip flop 316 is a latch type flip flop. The state of Node C as latched into element 316 is the final "decrease" output bit—it is valid on a subsequent rising edge of reference clock and is cleared shortly after that rising edge. Those skilled in the art will note that the mechanism described, namely the re-timing and handling of the asynchronous "decrease" event into the clock domain of the reference clock, has consumed some time. More, at least two cycles of the reference clock have elapsed. Thus, the rate of handling of down requests is limited. However, consideration of the final equilibrium state (the condition that the rate of "decrease" events equal the rate of 'increase" events) shows that only if the primary BRM output (which is synchronous) was operating with M>K/2 [from eq. 2], would the equilibrium rate ever exceed half of the rate of the reference clock. Consequently then, for this particular example of the synchronising means, M is constrained to be less than K/2. Therefore, no down requests can be missed as long as at least one can be registered within each clock cycle. In the preferred embodiment, the primary BRM is operating in the reference clock domain and no issues of synchronicity apply—it generates directly. the "increase" signal. By these means, the signal "decrease" and "increase" are now available to pass to the filter and VCO control input. In the most common implementation the "increase" and "decrease" of the signals would drive an analog circuit configured to operate as a "charge pump" in the conventional manner as used in the prior art of PLL and design.

In the embodiment described here in, the "increase" and "decrease" of a signal is utilized to drive a counter. The counter then drives a DAC, which is connected to the filter and hence to the VCO. The input reference clock signal 102 clocks a register (12 bits in this embodiment), in addition to all flip flops 302, 306, 316, and 322. The UP ("increase") signal is the signal at the output of the primary BRM and is connected to an adder cell carry input. The down ("decrease") signal, derived as described above, is connected to every bit of the adder B input port. The consequence of this connection is that the number in the register changes as follows:

(1) If neither Up nor Down is active: no change.
(2) If Up is active and Down inactive the number increments.
(3) If Up inactive and Down active the number decrements.
(4) If both Up and Down are active: no change.

The DAC connected to the register then generates the analog signal for the filter and the for the VCO. We use this DAC method to further reduce the noise in the VCO control voltage and allow a very small value of capacitor in the loop.

Still referring to FIG. 3, this is an example of logic that may be used to adjust the VCO frequency "up" or "down" in response to the BRM outputs. A single FF (302) is used to register the BRM output and its output (node A) indicates that the BRM (112) has generated an event. This event represents a request to "decrease" the VCO frequency. The remainder of the logic shown in FIG. 3 serves only to synchronise the output of 302 (the "decrease" event) into the reference clock domain and compare the "decrease" event against any pending "increase" event. Synchronisation in this example begins by the signal "A" being clocked into the FF (306) this FF being clocked by the reference clock (102) then represents the "decrease" event at node "B" shortly after the rising edge of the reference clock. We have effectively now synchronised the "decrease" event into the reference clock domain and have the signal pending on node "B". We now record this signal on node "C" by allowing the signal "B" to propagate through the inverter (308) and into the cross coupled gates (312 and 314). Upon the appearance of the signal at node "C" gates 310 and inverter 318 then feedback into the VCO clock domain and clear the FF (302) which in turn via inverter 304 clears the FF 306. Consequently at this time the "decrease" event is registered on node "C" held by the cross coupled gates (312 and 314) and the synchronisation mechanism (302 and 306) has been reset to await the next BRM (112) output event. Note that all this activity (registering the signal at C and resetting the synchronisation logic) has occurred shortly after the rising edge of the reference clock (102). The circuit persists in this condition (node C being asserted recording the "decrease"

event) until the falling edge of the reference clock. Upon the falling edge the level triggered (ie non Dtype) FF (316) closes and its output then holds the "decrease" signal during the clock low period. Upon the clock going low and FF (316) closing to hold the state of "C", the same low going clock propagates a resetting signal to the cross coupled gates (via its connection to one of the cross coupled gates 314 which then clears "C" via 312). Thus one constraint of this design is that the latch 316 close and sample "C" before the low going reference clock signal propagates through 314 and 312 to clear "C". The output of latch 316 is the final "decrease" event, set up on the falling edge of the reference clock and thus ready to control the register (322 in this example) on the next rising edge. No consideration of the BRM (106) is required—it is clocked by the reference clock and its output is therefore prepared shortly after the positive reference clock edge. The output of the "increase" BRM (106) and the now re-timed and prepared signal from the "decrease" BRM (112) are the state variable inputs to the register 322 which is then incremented or decrement as described. Specifically a multi-bit digital adder (320) is configured with the "increase" signal (from BRM 106) connected to the Cin (carry input) and a replica of the "decrease" signal (from 316) is provided to all the input bits of one input port (for example the "B" input port of the adder). The second input port (for example the "A" input port of the adder) is the output of the register 322. The "sum" port of the digital adder is the input to the register 322. Consideration of the action of the digital adder will show that this is a convenient configuration that results in the adjustment of the register 322 as follows: if on the positive edge of the clock the signals "increase" (from BRM 106) and "decrease" (from FF 316) are neither of them active, no change to the number in the register 322. If on the positive edge of the clock "increase" (from BRM 106) is active and "decrease" (from FF 316) is inactive, register 322 will be incremented by one because the carry input is in this case set, and the adder therefore adds one. If on the positive edge of the clock "increase" (from BRM 106) is inactive and "decrease" (from FF 316) is active, register 322 will be decremented by one because in this case the B port is representing −1 and the carry input is not set and the adder therefore subtracts one. If on the positive edge of the clock "increase" (from BRM 106) is active and "decrease" (from FF 316) is active no change to the number in the register 322 since the effect of the −1 represented on the B port is cancelled by the effect of the +1 represented on the Cin.

The invention has been described with reference to a frequency locked loop of improved performance and stability. This is accomplished by use of binary rate multipliers used to enable for the adjustment and control of the frequency of the signal that is being converted into the output. It will be appreciated by those skilled in the art, however, that the invention has broader utility. Other embodiments may be implemented according to the invention without departing from the spirit and scope of the invention, the scope of which is to be construed in accordance with the following claims and their equivalents. We make particular mention that the element described as a Binary rate Multiplier (BRM) could be implemented as a digital Sigma Delta (ΣΔ) modulator which is well known in the art. The clock to the ΣΔ device being the input, the controlling factor being the input word and the output being the ΣΔ output. The forgoing description is not intended to exclude the use of the ΣΔ modulator as the BRM element, indeed it is advantageous that a ΣΔ design be used since such a design is physically small and higher order modulators will show further improvements to the loop dynamics.

What is claimed is:

1. A frequency locked loop device having improved stability, comprising:
   an input for receiving an input signal;
   an output for outputting an output signal having a different frequency than the input;
   a primary channel having a binary rate multiplier circuit configured to factor in a first factor value to produce a first factored input;
   a secondary binary rate multiplier channel configured to receive the output signal from the output and to factor in a second factor value to produce a second factor input; and
   a frequency detector configured to receive the first factored input from the primary channel and the second factored input from the secondary channel, the frequency detector having a frequency differencing circuit configured to calculate the difference between the first factored input and the second factored input and to produce an output based on the difference.

2. A frequency locked loop according to claim 1, wherein the primary channel includes a binary rate multiplier configured to factor in the a first factor to the input signal to modify its frequency.

3. A frequency locked loop according to claim 1, wherein the primary channel includes a binary rate multiplier configured to factor in the a first factor to the input signal to reduce its frequency.

4. A frequency locked loop according to claim 1, wherein the secondary channel includes a binary rate multiplier configured to factor in a second factor to the output signal to modify its frequency and to transmit the second factored input to the frequency detector to operate as a feedback loop between the output and the frequency detector.

5. A frequency locked loop according to claim 1, wherein the secondary channel includes a binary rate multiplier configured to factor in the a second factor to the output signal to reduce its frequency and to transmit the second factored input to the frequency detector to operate as a feedback loop between the output and the frequency detector.

6. A frequency lacked loop according to claim 1, wherein the secondary channel includes a binary rate multiplier configured to factor in a second factor to the output signal to modify its frequency and to transmit the second factored input to the frequency detector to operate as a feedback loop between the output and the frequency detectors.

7. A frequency locked loop according to claim 1, further comprising a voltage control oscillator configured to receive the output from the frequency detector, and to produce an output signal and to control the frequency of the output signal in response to the output received from the frequency detector, wherein the secondary channel operates as a feedback loop from the voltage control oscillator to the frequency detector
   wherein the voltage controlled oscillator is made up of more than one phase, and wherein the first factor is derived from the number of phases in the voltage control oscillator.

8. A frequency locked loop according to claim 1, wherein the second factor is derived from the number of signal pulses that occur between corrections made in the frequency detector.

9. A frequency locked loop according to claim 1, wherein the second factor is derived from the number of signal pulses that occur between corrections made in the frequency detector divided by a predetermined number.

10. A method of performing frequency locked loop device having improved stability, comprising:

receiving an input signal;

factoring in a first factor value to produce a first factored input;

receiving an output signal from the output and to factor in a second factor value to produce a second factor input; and receiving the first factored input from the primary channel and the second factored input from the secondary channel;

calculating the difference between the first factored input and the second factored input; and producing an output signal based on the difference between the first factored input and the second factored input.

11. A method according to claim 10, further comprising:

receiving the output from the frequency detector; and producing an output signal and to control the frequency of the output signal in response to the output received.

12. A method according to claim 10, further comprising:

factoring in the first factor to the input signal to modify the signal frequency.

* * * * *